United States Patent
Gong et al.

(10) Patent No.: US 7,987,059 B2
(45) Date of Patent: Jul. 26, 2011

(54) REAL-TIME POWER SYSTEM OSCILLATION DETECTION USING MODAL ANALYSIS

(75) Inventors: Yanfeng Gong, Pullman, WA (US); Armando Guzman-Casillas, Pullman, WA (US)

(73) Assignee: Schweitzer Engineering Laboratories, Inc, Pullman, WA (US)

( * ) Notice: Subject to any disclaimer, the term of this patent is extended or adjusted under 35 U.S.C. 154(b) by 345 days.

(21) Appl. No.: 12/247,746

(22) Filed: Oct. 8, 2008

(65) Prior Publication Data
US 2009/0099798 A1 Apr. 16, 2009

Related U.S. Application Data

(60) Provisional application No. 60/998,109, filed on Oct. 9, 2007.

(51) Int. Cl.
*H02J 3/24* (2006.01)
*H02J 3/00* (2006.01)
*G06F 19/00* (2011.01)
*G06F 17/40* (2006.01)

(52) U.S. Cl. ......... 702/66; 73/865.8; 307/102; 307/149; 324/76.11; 324/537; 324/764.01; 700/286; 700/294; 702/69; 702/187; 702/189

(58) Field of Classification Search ................ 73/432.1, 73/865.8; 307/106, 149, 102; 324/76.11, 324/76.12, 102, 500, 509, 537, 764.01, 765.01; 700/1, 90, 286, 292, 293, 294; 702/1, 57, 702/58, 60, 64, 66, 69, 71, 73, 74, 182, 187, 702/189, 190, 127
See application file for complete search history.

(56) References Cited

U.S. PATENT DOCUMENTS

| | | | |
|---|---|---|---|
| 4,646,218 A * | 2/1987 | Scholer | 363/21.08 |
| 4,928,054 A * | 5/1990 | Martin-Lopez | 323/288 |
| 6,219,591 B1 | 4/2001 | Vu | |
| 6,236,949 B1 | 5/2001 | Hart | |
| 6,249,876 B1 * | 6/2001 | Balakrishnan et al. | 713/501 |
| 6,476,521 B1 | 11/2002 | Lof | |
| 6,662,124 B2 | 12/2003 | Schweitzer | |
| 6,694,270 B2 | 2/2004 | Hart | |
| 6,845,333 B2 | 1/2005 | Anderson | |
| 7,149,637 B2 * | 12/2006 | Korba et al. | 702/60 |
| 7,480,580 B2 | 1/2009 | Zweigle | |
| 7,630,863 B2 | 12/2009 | Zweigle | |
| 2003/0220752 A1 | 11/2003 | Hart | |
| 2004/0059469 A1 | 3/2004 | Hart | |
| 2004/0093177 A1 | 5/2004 | Schweitzer | |
| 2005/0187726 A1 | 8/2005 | Korba | |
| 2006/0067095 A1 | 3/2006 | Hou | |
| 2006/0224336 A1 | 10/2006 | Petras | |
| 2007/0206644 A1 | 9/2007 | Bertsch | |
| 2009/0089608 A1 | 4/2009 | Guzman | |

OTHER PUBLICATIONS

A.P. Sakis Meliopoulos, George J. Cokkinides, Floyd Galvan, Bruce Fardanesh, Distributed State Estimator—Advances and Demonstration, Jan. 7, 2008.

(Continued)

*Primary Examiner* — Edward R Cosimano
(74) *Attorney, Agent, or Firm* — Eugene M. Cummings, PC

(57) ABSTRACT

A power system oscillation detection device is provided for use in an electric power system. A plurality of sample signals are acquired from the electrical power system via a plurality of intelligent electronic devices (IEDs) in communication with the power system. The power system oscillation detection device includes a real-time modal analysis module, a real-time mode identification module, and real-time decision and control logic. The real-time modal analysis module calculates modes of at least one of the signals, each mode including mode information. The real-time mode identification module together with the real-time decision and control logic determines, from the mode information, whether there is an undesirable oscillation in the electric power system and activates a remedial action.

36 Claims, 11 Drawing Sheets

OTHER PUBLICATIONS

Saman A. Zonouz and William H. Sanders, A Kalman-based Coordination for Hierarchical State Estimation: Algorithm and Analysis, Jan. 7, 2008.

Jinyu Xiao, Xiaorong Xie, Yingduo Han, Jingtao Wu, Dynamic Tracking of Low-frequency Oscillations with Improved Prony Method in Wide-Area Measurement System, 2004.

Patent Cooperation Treaty, International Search Report and Written Opinion of the International Searching Authority, PCT/US2008/079219, Apr. 9, 2010.

Olof Samuelsson, Helga Johannsdottir, Nils Gustafson, Thorhallurhrafnsson Daniel Karlsson, Mike Kockott, Johan Salj, Arve Sollie, Power System Damping in Iceland Based on Phasor Measurements, 2002.

* cited by examiner

REAL-TIME POWER SYSTEM OSCILLATION DETECTION USING MODAL ANALYSIS

CROSS-REFERENCE TO RELATED APPLICATIONS

This application claims benefit under 35 U.S.C. §119(e) of U.S. Provisional Application Ser. No. 60/998,109, (now expired) entitled "REAL-TIME POWER SYSTEM OSCILLATION DETECTION USING MODAL ANALYSIS," filed Oct. 9, 2007, naming Armando Guzman-Casillas, Yanfeng Gong and Charles E. Petras as inventors, the complete disclosure thereof being incorporated herein by reference.

FIELD OF THE INVENTION

The present invention relates generally to a device and system for detecting oscillation in a power system. More specifically, a device and system is provided which receives phasor measurements in real-time and processes such data using modal analysis to provide oscillation detection in a power system.

BACKGROUND OF THE INVENTION

Power system disturbances, such as line tripping and drop of generation, cause local and inter-area power system oscillations. Usually, local oscillation modes range in frequency from 0.7 to 2.0 Hz. Inter-area oscillation, which refers generally to a group of generators in one area that swing against a group of generators in another area, normally ranges in frequency from 0.1 to 0.8 Hz. The local oscillation involves a few generators within a small portion of a power system and has little impact on an overall power system. Inter-area oscillations constrain the amount of power that can be transferred through some parts of interconnected power grids. Without proper remedial actions, inter-area oscillation can result in power system separations or major blackouts.

Wide-Area Measurement Systems (WAMSs) are used to monitor power system disturbances. WAMSs generally include among other things phasor measurement units (PMUs), phasor data concentrators (PDCs), visualization software and data archiver software. PMUs, or relays with phasor measurement capabilities, are placed at various locations of the power system to acquire voltage and current phasor measurements therefrom. These PMUs may be adapted to time-stamp such data. PDCs may be adapted to collect the phasor measurements from the PMUs and time-align such data. Using visualization and data archiver software, the power system may be monitored using phasor measurements acquired by the PMUs. In this way, WAMSs generally provide real-time information relating to transmission line power flows, bus voltage magnitude and angle, and frequency measurements across the transmission network. WAMSs also provide information for post-mortem analysis (e.g., power system modal analysis for determining inter-area oscillation).

With similar system architecture, Wide-Area Control Systems (WACS) and Wide-Area Protection Systems (WAPS) have also been used to control devices within the power system. For example, FIG. 1 illustrates a prior art system which uses time-correlated data to monitor and control power systems. The system of FIG. 1 generally comprises a plurality of PMUs 100a, 100b, 100c; a PDC 102; a control unit 104 and a command unit 106. The PMUs 100a, 100b, 100c are placed at various locations of the power system to acquire voltage and current phasor measurements therefrom. These PMUs may be adapted to time-stamp such data. The PDC 102 is adapted to collect the phasor measurements from the PMUs and time-align such data. A control unit 104 is provided to generally process the time-aligned data and determine whether the command unit 106 should send a subsequent command to appropriate power system devices or power system elements for protection and/or control functionality (e.g., shed generation, insert a system braking resistor or control a Static VAR Compensator). Nevertheless, the complex system illustrated in FIG. 1 consists of a disjointed and fragmented collection of devices that make the system unreliable and difficult to implement.

Several desired benefits of the preferred embodiments, including combinations of features thereof, of the invention will become apparent from the following description. It will be understood, however, that an arrangement could still appropriate the claimed invention without accomplishing each and every one of these desired benefits, including those gleaned from the following description. The appended claims, not these desired benefits, define the subject matter of the invention. Any and all benefits are derived from the multiple embodiments of the invention, not necessarily the invention in general.

SUMMARY OF THE INVENTION

A power system oscillation detection device is provided for use in an electric power system. A plurality of sample signals are acquired from the electrical power system via a plurality of intelligent electronic devices (IEDs) in communication with the power system. The power system oscillation detection device includes a real-time modal analysis module and a real-time mode identification module. The real-time modal analysis module calculates modes of at least one of the signals, each mode including mode information. The real-time mode identification module determines, from the mode information, whether there is an undesirable oscillation in the electric power system. In yet another aspect, provided is a system for determining whether there is an undesirable oscillation in the electric power system utilizing the above device.

In yet another aspect, provided is a method for detecting oscillation in an electric power system using samples from a plurality of signals from a plurality of intelligent electronic devices (IEDs) in communication with the power system. The method generally includes the steps of acquiring the time stamped samples of a power system signal from one or more of the IEDs; calculating mode information from the time stamped samples; identifying a mode frequency, amplitude, damping constant, and/or phase; and detecting power system oscillation using the mode information.

BRIEF DESCRIPTION OF THE DRAWINGS

FIG. 8b is a screenshot of a user configuration software program for configuring the conditioning module and the modal analysis module of FIG. 8a.

DESCRIPTION OF THE VARIOUS EMBODIMENTS

Provided is a system and device which receives power system data in real-time and processes such data using modal analysis to provide oscillation detection in a power system. Generally, the device is adapted to receive phasor data and process such data using modal analysis in order to provide among other things oscillation detection in a power system. The device may be further adapted to send control data or signals to other power system devices in real-time in order to prevent power system collapse.

Figure 1:
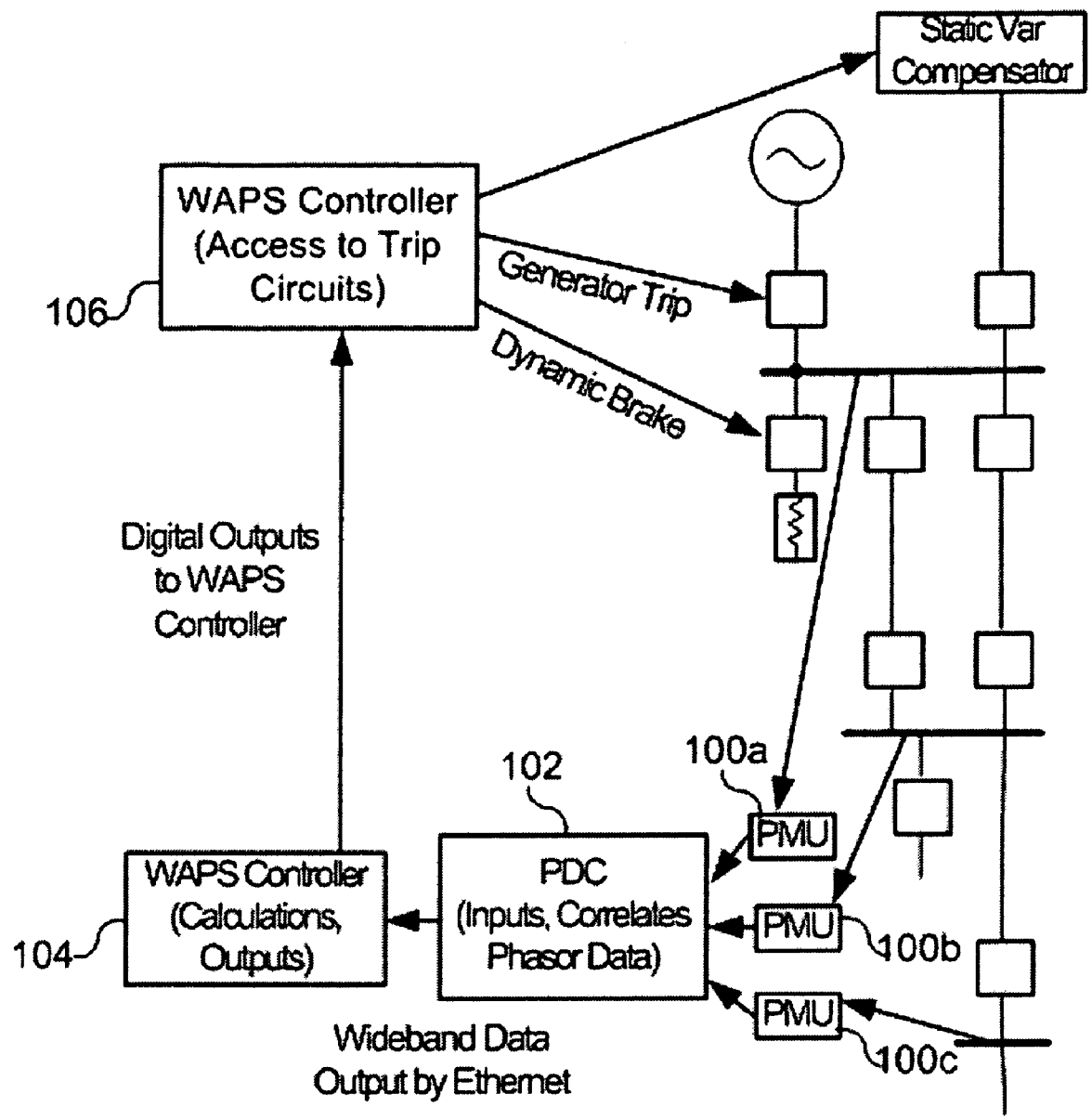
FIG. 1 is a general block diagram of prior art system which uses time-correlated data to monitor and control power systems.
Figure 2:
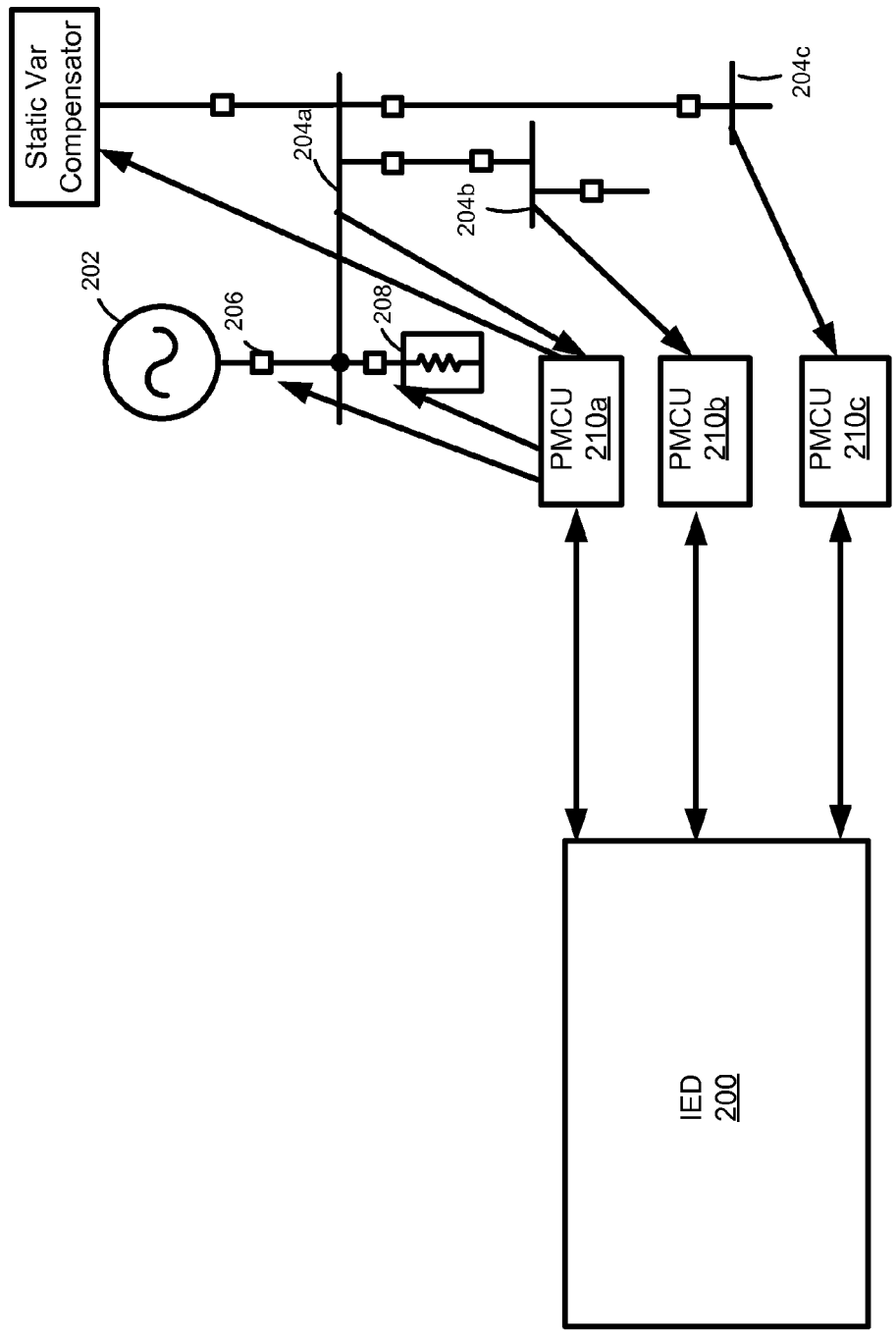
FIG. 2 is a general block diagram of a system for monitoring and protecting an electrical power system.

For example, as shown in FIG. 2, a device 200 is provided for detecting oscillation in an electric power system. The electric power system includes various elements used for power transmission and/or distribution. As depicted, the electric power system includes a generator 202 connected a bus 204a via a circuit breaker 206. Also connected to bus 204a via a circuit breaker is load 208. Power lines leading to busses 204b and 204c are also connected to bus 204a via circuit breakers.

Intelligent Electric Devices (IED) in the form of Phasor Measurement and Control Units (PMCUs) or relay 210a, 210b, 210c are also connected to elements of the power system. The PMCUs 210a, 210b, 210 c are adapted to acquire power system data including but not limited to phasor data. The data may include phasor measurements, synchronized phasor measurements, real values, Boolean values, and the like. More specifically, the PMCUs 210a, 210b, 210c may be adapted to sample a signal waveform on the elements of the power system to which they are connected. For example, PMCU 210a may be adapted to sample a signal waveform present on bus 204a. The signal waveform may include a voltage or a current waveform. The PMCUs 210a, 210b, 210c may also be adapted to perform calculations on the sampled signal waveforms to calculate current and voltage phasors as well as correction factors for modifying the magnitude and phase of each phasor measurement. The PMCUs 210a, 210b, 210c may further be adapted to acquire other power system data.

A device 200 is generally adapted to receive power system data including phasor data from various locations in the power system via the PMCUs 210 a, 210b, 210c. Device 200 may be in the form of an intelligent electronic device (IED), synchrophasor processor, phasor data concentrator (PDC), phasor measurement unit (PMCU), protective relay, a computing device, or any similar power system device. The device 200 may be adapted to time-align this phasor data or, alternatively, another associated device (not shown) may be provided to time-align this phasor data. The device 200 generally includes a processor including a modal analysis module for performing, among other things, vector and scalar calculations on the phasor data along with real values and Boolean values in a time deterministic fashion, generally about real-time. More specifically, the device 200 generally includes a real-time modal analysis module for calculating modes of at least one of the signals, each mode including mode information. The calculated mode information may include modal amplitude, phase, frequency, damping constant, and damping ratio. The device 200 additionally includes a real-time mode identification module for determining, from the mode information, whether there is an undesirable oscillation in the electric power system. Using this mode information, the device 200 provides output data and/or signals in order to initiate various control and/or monitoring functions to control other power system devices or power system elements.

Figure 3:
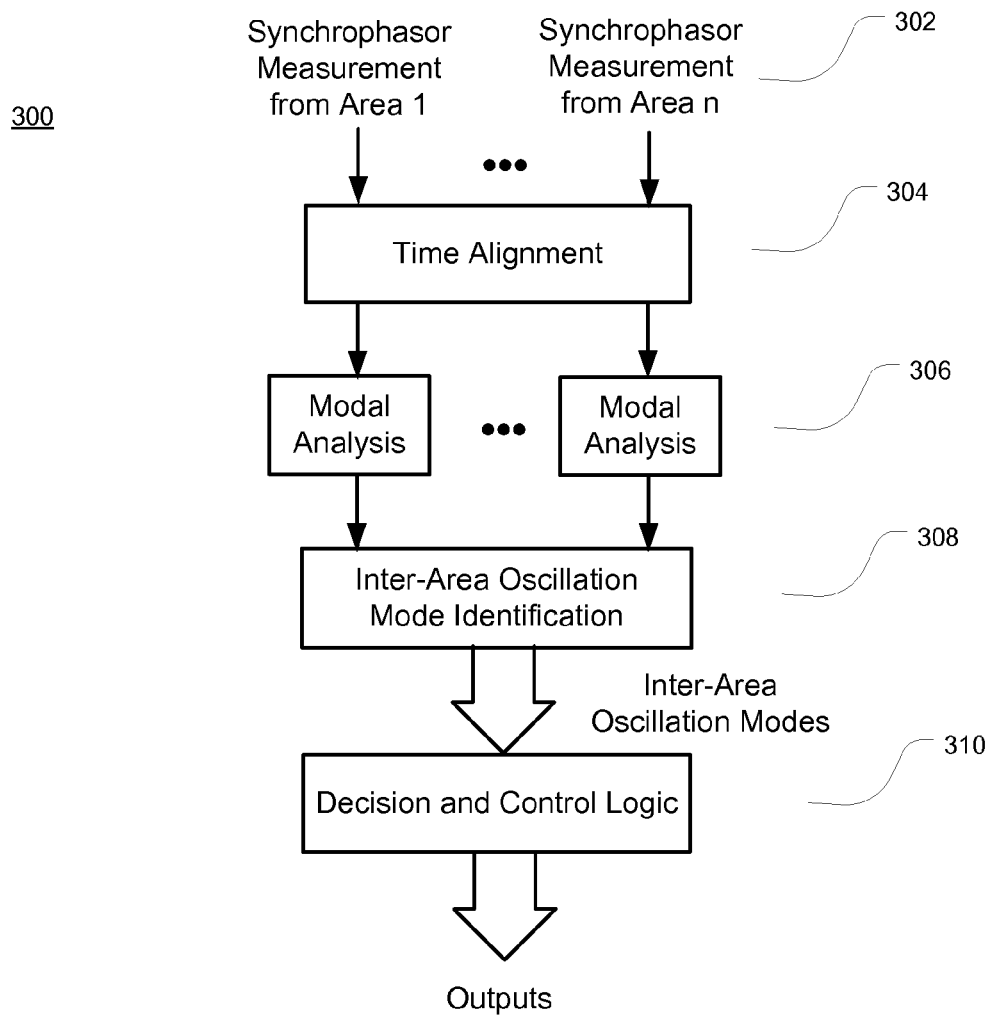
FIG. 3 is a flowchart illustrating a process for monitoring and controlling an electrical power system using modal analysis.

FIG. 3 is flowchart illustrating a method 300 for detecting oscillation in an electric power system using modal analysis. Generally, a power system signal is sampled at various areas in the power system (step 302). The samples include power system data which further includes, but is not limited to phasor measurements, synchronized phasor measurements, real values, Boolean values, and the like. These acquired signal samples are time-aligned (step 304). The time-aligned samples are processed in real-time for calculating modes of at least one of the signals, each mode including mode information (i.e., performing modal analysis at step 306). The calculated mode information may include modal amplitude, phase, frequency, damping constant, and damping ratio. From the mode information, it is determined whether there is an undesirable oscillation in the electric power system (i.e., performing mode identification at step 308). Using this mode information, output data and/or signals are provided in order to initiate various control and/or monitoring functions to control other power system devices or power system elements to correct the detected oscillation (step 310).

Figure 4:
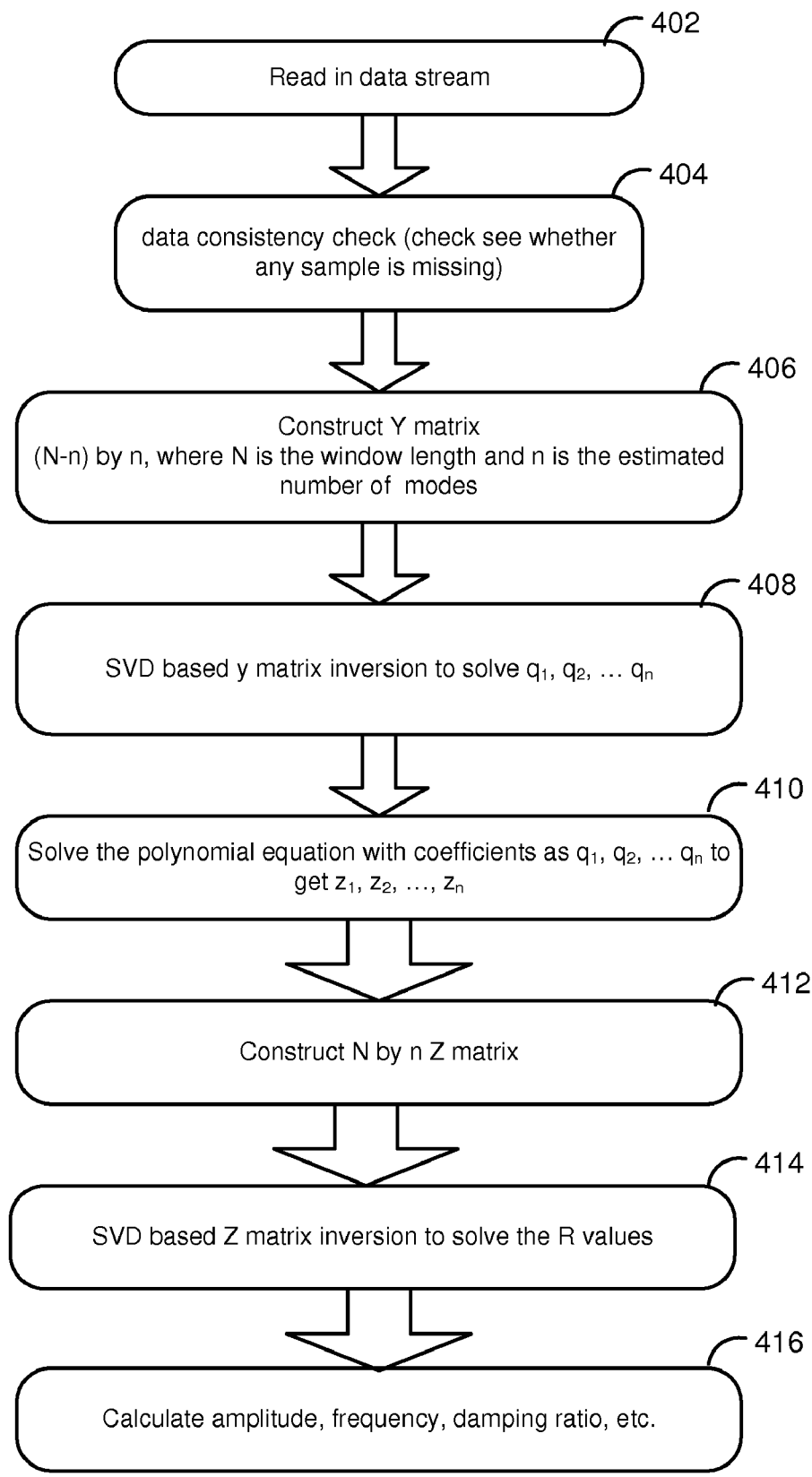
FIG. 4 is a flowchart illustrating an example of a process for performing modal analysis in the modal analysis step of FIG. 3.

FIG. 4 a flowchart illustrating an example of modal analysis process which may be used at step 306 of FIG. 3. The modal analysis process of FIG. 4 may further be implemented into the logic of a device for detecting oscillation in a power system. As discussed above, modal analysis may be used to analyze the power system data including phasor data of various signals from the power system. The data for each signal may include among other things frequency, phasor magnitude, phasor angle, analog value, power, and angle difference measurements. The modal analysis performed at step 306 is achieved by calculating the mode information for each of the signals. Mode information may include information such as amplitude, phase, frequency, damping, and damping ratio of the phasor data.

The modal analysis process may incorporate any number of analysis methods to determine the mode information of the measurement data. Some analysis methods for determining mode information include Prony Analysis, Fourier Analysis, Matrix Pencil Analysis, a Modified Prony Analysis or other comparable modal analysis methods.

For example, Prony analysis fits a linear model to a measured signal y(t). Measured signal y(t) is the output signal of a linear dynamic system. A model may be represented with poles and residues of the corresponding transfer function.

Using Prony Analysis, mode information of the output signal may be calculated. The mode information of the output signal corresponds to the mode information of the linear system that generated the signal.

A power system model is linerized around its operating point for small signal stability analysis. The state-space representation of the linearized system has the form of Equations (1) and (2), where A is the state matrix, $\Delta x$ is the state vector, $\Delta u$ is a single input, $\Delta y$ is a single output, c is a row vector, b is a column vector, and d is zero.

$$\Delta \dot{x} = A \cdot \Delta x + b \cdot \Delta u \qquad (1)$$

$$\Delta y = c \cdot \Delta x + d \cdot \Delta u \qquad (2)$$

The corresponding transfer function is represented in Equations (3) and (4).

$$G(s) = \frac{\Delta y(s)}{\Delta u(s)} = \sum_{i=1}^{n} \frac{R_i}{s - \lambda_i} \qquad (3)$$

$$R_i = c \cdot \Gamma_i \Pi_i b \qquad (4)$$

In Equations (3) and (4), $\Gamma$ is the right eigenvector, $\Pi$ is the left eigenvector, and $\lambda$ is the corresponding eigenvalue. The system time response is represented in Equation (5).

$$y(t) = \sum_{i=1}^{n} R_i \cdot e^{\lambda_i \cdot t} \qquad (5)$$

The discrete representation of Equation (5) for a signal sample at $\Delta t$ time intervals is represented in Equations (6) and (7).

$$y(k) = \sum_{i=1}^{n} R_i \cdot z_i^k \qquad (6)$$

$$z_i = e^{\lambda_i \cdot \Delta t} \qquad (7)$$

Equation (6) may be re-written for an observation window of N samples as follows in Equation (8).

$$\begin{bmatrix} y(0) \\ y(1) \\ \vdots \\ y(N-1) \end{bmatrix} = \begin{bmatrix} z_1^0 & z_2^0 & \cdots & z_n^0 \\ z_1^1 & z_2^1 & \cdots & z_n^1 \\ \vdots & \vdots & \vdots & \vdots \\ z_1^{N-1} & z_2^{N-1} & \cdots & z_n^{N-1} \end{bmatrix} \begin{bmatrix} R_1 \\ R_2 \\ \vdots \\ R_n \end{bmatrix} \qquad (8)$$

The system eigenvalues i, may be calculated from zi. Necessary roots of an nth order polynomial (indicated as zi) with qi coefficients that satisfy Equation (9).

$$z^n - (q_1 \cdot z^{n-1} + q_2 \cdot z^{n-2} + \ldots + q_n \cdot z^0) = 0 \qquad (9)$$

The Prony Method uses the measured samples and arranges them according to Equation (10) to obtain the $q_i$ vector. This model constitutes the linear predictor model that fits the measured signal.

$$\begin{bmatrix} y(n-1) & y(n-2) & \cdots & y(0) \\ y(n-0) & y(n-1) & \cdots & y(1) \\ \cdots & \cdots & \cdots & \cdots \\ y(N-2) & y(N-3) & \cdots & y(N-n-1) \end{bmatrix} \begin{bmatrix} q_1 \\ q_2 \\ \vdots \\ q_n \end{bmatrix} = \begin{bmatrix} y(n+0) \\ y(n+1) \\ \vdots \\ y(N-1) \end{bmatrix} \qquad (10)$$

To fit the measured signal, first the linear predictor model (Equation (10)) that fits the measured signal must be constructed, and the $q_i$ vector must be calculated. Next, the roots of the characterized polynomial associated with the linear predictor model must be found (Equation (9)) to obtain $z_i$. The roots are used to calculate $R_i$ from Equation (8). Eigenvalues, amplitude, and phase for each mode are then determined.

Given the roots (zi) of the polynomial equation, the ith eigenvalues for each mode are calculated using Equation (11).

$$\lambda_i = \log(Z_i) \cdot \text{Message\_Rate} \qquad (11)$$

The mode frequency is calculated using Equation (12).

$$f_{mode\_i} = \frac{imag(\lambda_i)}{2\pi} \qquad (12)$$

The mode damping constant is calculated using Equation (13).

$$\text{Damp}_i = real(\lambda_i) \qquad (13)$$

The mode damping ratio is calculated using Equation (14):

$$DampRatio_i = -\frac{real(\lambda_i)}{abs(\lambda_i)} \qquad (14)$$

Given the ith residual value calculated from Prony Analysis, the amplitude of the ith mode is calculated using Equation (15).

$$\text{Amp}_i = abs(\text{Residual}_i) \qquad (15)$$

The phase angle of the ith mode is calculated using Equation (16).

$$phase_i = atan\left[\frac{imag(Residual_i)}{real(Residual_i)}\right] \frac{180}{\pi} \qquad (16)$$

Additionally, the estimated signal may be compared against the original signal. To quantify the quality of the fit, the signal-to-noise ratio may be calculated in dBs, SNR, according to Equation (17) where y(k) is the original signal and (k) is the estimated signal.

$$SNR = 20 \cdot \log\left(\frac{\|y(k)\|}{\hat{y}(k) - y(k)\|}\right) \qquad (17)$$

A method of implementing the above steps 400 is illustrated in FIG. 4. The power system data stream (including phasor measurements) for each received power system signal is read into the modal analysis module (at step 402). The power system data is checked (at step 404) to verify if any data is missing. A matrix (e.g., herein referred to as Y matrix) is constructed at step 406. The matrix is (N-n) by n, where N is the window length and n is the estimated number of modes (see Equation (10)). The singular value decomposition (SVD) based y matrix inversion is used to solve $q_i$ coefficients at step 408. The polynomial equation with coefficients as $q_i$ is solved to obtain $z_i$ at step 410. An N by n Z matrix is constructed at step 412 (see Equation 8). SVD based Z-matrix inversion is performed to solve the R values at step 414. Finally, mode information such as the amplitude, frequency, damping ratio, and the like are computed (at step 416) using, for example, Equations (11)-(17).

Figure 5:
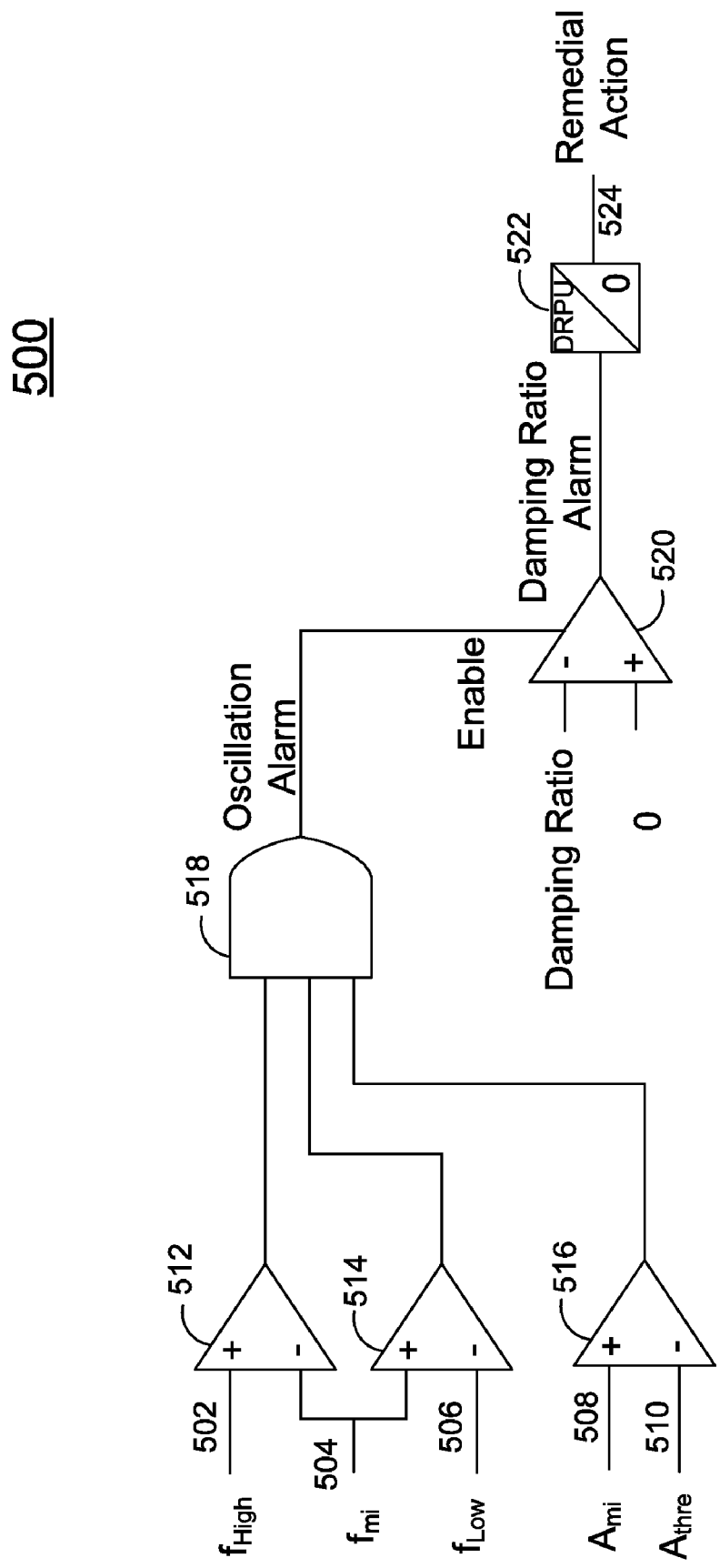
FIG. 5 is a general block diagram illustrating mode identification logic for performing mode identification in the mode identification step of FIG. 3.

FIG. 5 is a general block diagram illustrating decision and control logic which may be used at step 310 of FIG. 3. The decision and control logic of FIG. 5 may further be implemented in conjunction with the oscillation mode identification process 308 for detecting oscillations in a power system. As discussed above, the modal analysis process 306 involves the analyses of power system data and calculation mode information from that data. From this calculated mode information data, the decision and control logic may be adapted to identify such mode information and transmit data and/or signals in response thereto. For example, the decision and control logic may be adapted to issue an alarm or a control signal which indicates that remedial action needs to be taken.

More specifically, as shown in the logic diagram of FIG. 5, the logic 500 includes various inputs. The measured frequency $f_{mi}$ 504 is compared against a user-defined low threshold $f_{low}$ 506 in comparator 514, and against a user-defined high threshold $f_{high}$ 502 in comparator 512. If the measured frequency $f_{mi}$ 504 is within the low and high thresholds, then both comparators 512, 514 assert to junction 518. Another input is the measured amplitude $A_{mi}$ 508 and a user-defined amplitude threshold $A_{thre}$ 510. These are compared in comparator 516, where, if the measured amplitude $A_{mi}$ 508 is greater than the amplitude threshold $A_{thre}$ 510, the comparator 516 asserts to junction 518. If junction 518 receives assertions from all three comparators 512, 514, and 516, then it enables a damping ratio check in the form of a comparator 520 for comparing the damping ratio against zero. If the damping ratio is negative (i.e., the data set indicates negative damping ratio), then the comparator 520 asserts, and a counter 522 is initiated. If the damping ratio is negative for a time longer than a select threshold (e.g., the Damping Ratio Alarm), a remedial action 524 is instigated.

Figure 6:
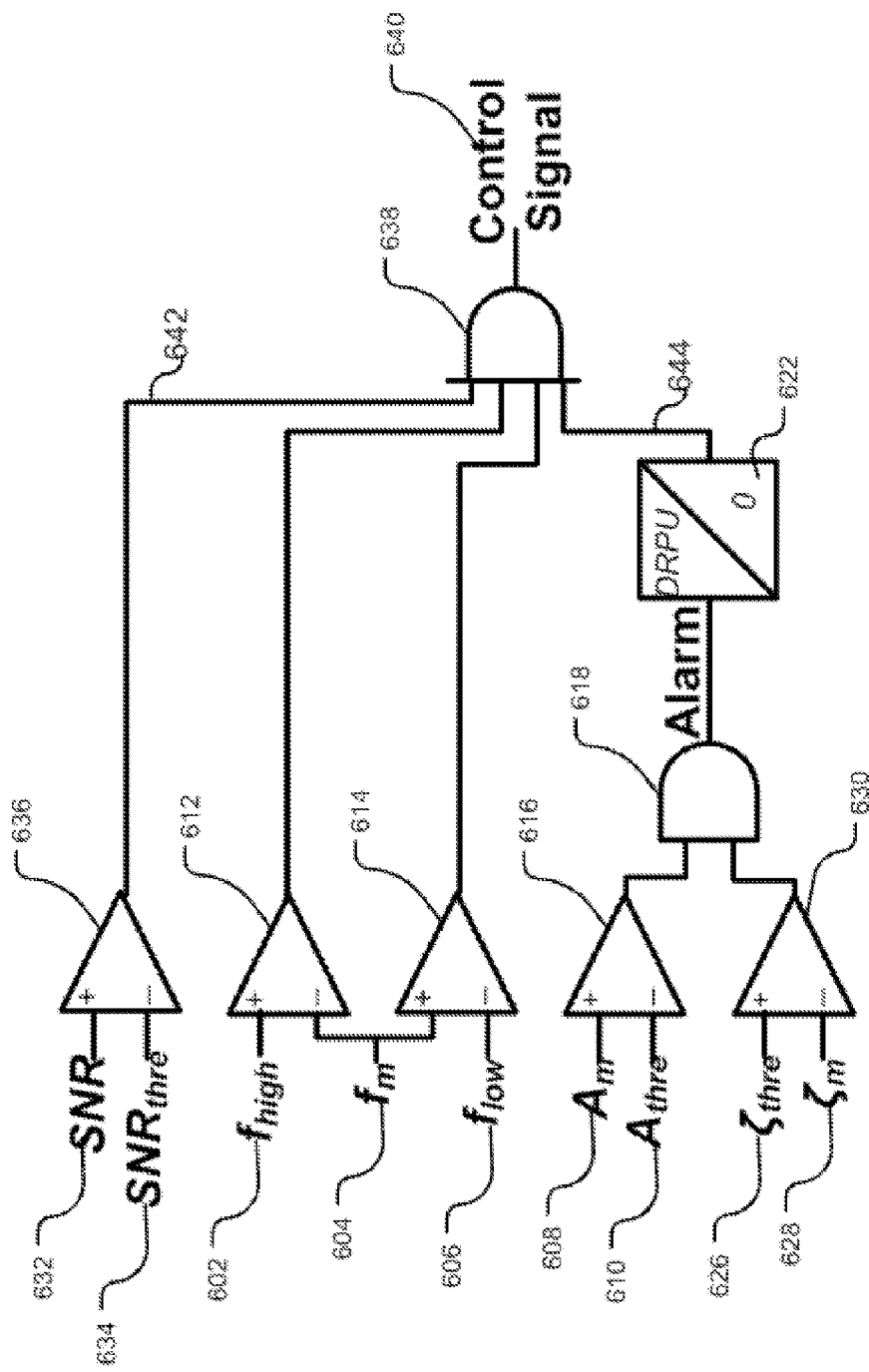
FIG. 6 is a general block diagram illustrating mode identification logic for performing mode identification in the mode identification step of FIG. 3.

FIG. 6 is a general block diagram illustrating another embodiment of decision and control logic which may be used at step 310 of FIG. 3. The decision and control logic of FIG. 6 may further be implemented in conjunction with the oscillation mode identification process 308 for detecting oscillation in a power system. More specifically, as shown in the logic diagram of FIG. 6, the logic includes various inputs. The measured frequency $f_m$ 604 is compared against a user-defined low threshold $f_{low}$ 606 in comparator 614, and against a user-defined high threshold $f_{high}$ 602 in comparator 612. If the measured frequency $f_m$ 604 is within the low and high thresholds, then both comparators 612, 614 assert junction 638.

Another input is the measured amplitude $A_m$ 608 and a user-defined amplitude threshold $A_{thre}$ 610. These inputs are compared in comparator 616, where, if the measured amplitude $A_m$ 608 is greater than the amplitude threshold $A_{thre}$ 610, the comparator 616 asserts to junction 618. Another input is the measured damping ratio $\zeta_m$ 628 and a user-defined damping ratio threshold $\zeta_{thre}$ 626. These inputs are compared in comparator 630, where, if the measured damping ratio $\zeta_m$ 628 is less than the damping ratio threshold $\zeta_{thre}$ 626 (indicating that the damping ratio $\zeta_m$ 628 is less than the damping ratio threshold $\zeta_{thre}$ 626), the comparator 630 asserts junction 618. If junction 618 receives assertions from both comparators 616 and 630, then it enables an alarm and a counter 622. If the damping ratio $\zeta_m$ 628 is less than the damping ratio threshold $\zeta_{thre}$ 626 for a time longer than a select threshold (e.g., the Damping Ratio Pickup, DRPU) as determined by counter 622, output 644 is asserted.

Other inputs to the logic are the measured signal-noise ratio SNR 632 and a user-defined signal-noise ratio threshold $SNR_{thre}$ 634. These inputs are compared in comparator 636, where, if the measured signal-noise ratio SNR 632 is greater than the signal-noise ratio threshold $SNR_{thre}$ 634, the comparator 636 asserts output 642 to junction 638.

If comparators 636, 612 and 614 assert and the damping ratio is less than the damping ratio threshold $\zeta_{thre}$ 626 for a time longer than a select threshold, junction 638 is asserted and a control signal (e.g., a remedial action) 640 is instigated.

Figure 7A:
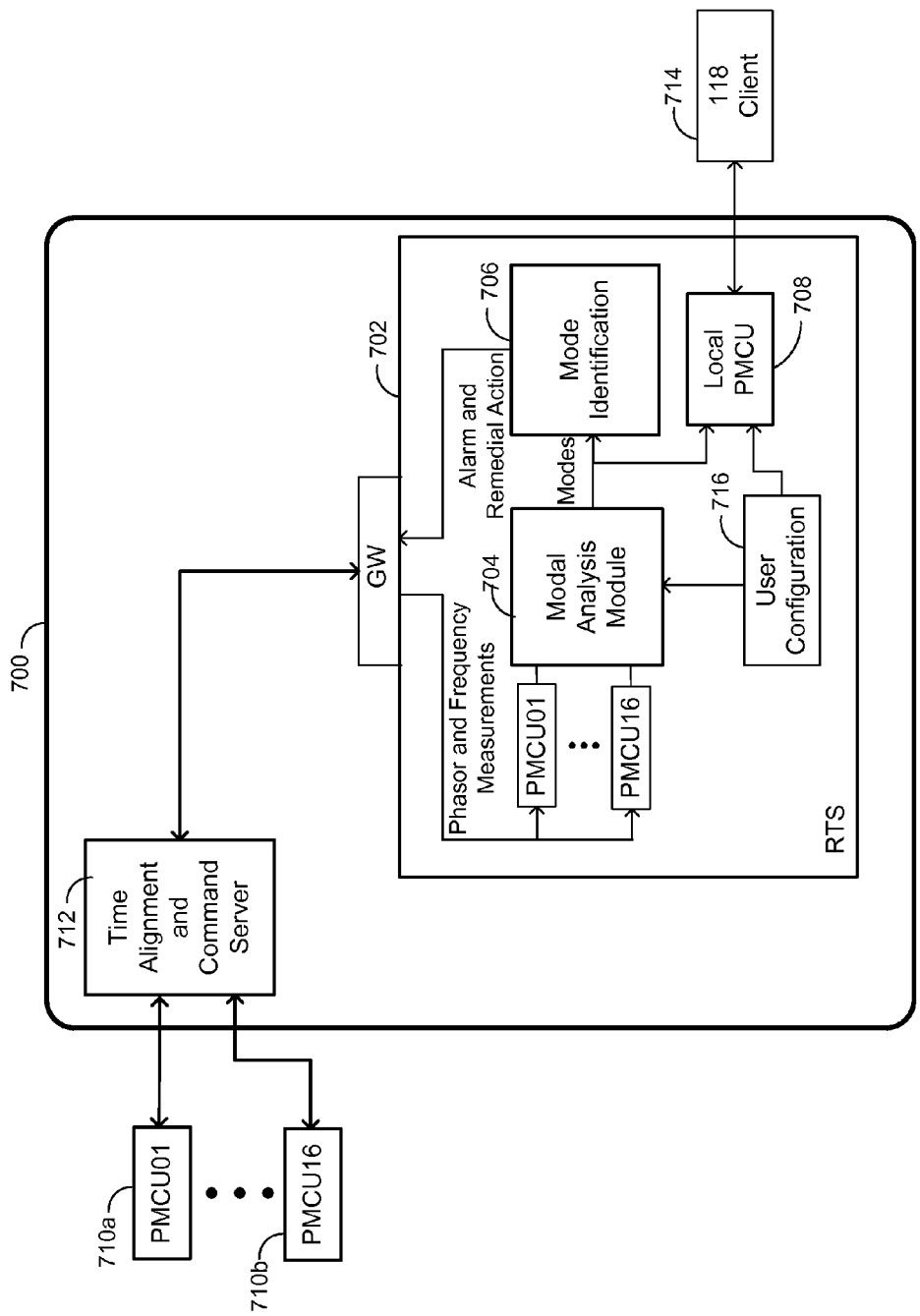
FIG. 7a is a general block diagram of a device including a modal analysis module and a mode identification module.

FIG. 7a is a general block diagram of the internal architecture for a device 700 including a processor 702 having modal analysis module 704 and a mode identification module 706 which may be used in the system of FIG. 2. The processor 702 may be adapted to perform the process of as outlined in FIG. 3. The modal analysis module 704 may include the process modal analysis 306 as outlined in FIG. 3, whereas the mode identification module 706 may include the process oscillation mode identification 308 and the decision and control logic 310 as outlined in FIG. 3.

More specifically, the processor 702 may be adapted to, among other things, perform vector and scalar calculations on the phasor data along with real values and Boolean values in a time deterministic fashion, generally about real-time. These calculations are generally performed by a modal analysis module 704 which analyzes the power system data including phasor data of various signals from the power system to calculate mode information for each of the signals. The data for each signal may include among other things frequency, phasor magnitude, phasor angle, analog value, power, and angle difference measurements. Mode information may include information such as amplitude, phase, frequency, damping, and damping ratio of the input data. From this calculated mode information data, a mode identification module 706 identifies such mode information and transmit data and/or signals in response thereto (e.g., issue an alarm or a control signal which indicates that remedial action needs to be taken). For example, the received data include phasor measurement data, synchronized phasor measurement data or synchrophasor data.

More specifically, the device 700 may generally include a plurality of communications channels for receiving power system data including phasor data from a plurality of power system devices or elements associated with an area of the power system (e.g., from PMCUs 710a, 710b). For example, the received power system data may include data having phasor measurement data, or synchronized phasor measurement. In one example, each of the power system devices (e.g., PMCUs 710a, 710b) may be communicatively coupled to a current and/or voltage sensor, which may be configured to obtain current and/or voltage measurements. The current and/or phase measurements obtained by sensors may comprise measurements of one or more phases of a three-phase current and/or voltage signal. The power system data may be transferred via a number of communications messaging or protocols format/structures, including but not limited to IEEE C37.118 messages (as shown herein), serial communications, IP/Ethernet protocols (e.g., SCADA, and/or protection messages), input commands and the like.

The power system data received from the PMCUs 710a, 710b over the bi-directional communications link 118 may be time-aligned in the time alignment and command server module 712 using the time stamps associated with the power system data. In such an arrangement, the time stamps are provided by each of the PMCUs 710a, 710b. Examples of messaging formats or protocols which include time information in the form of a timestamp or otherwise include the IEEE C37.118 (as shown herein), IEC 61850 and SEL Synchrophasor Fast Message protocols. It is to note that the time alignment and command server module 712 may be separate and apart from the device 700 without deviating from the spirit of the invention.

Alternatively, the device 700 may be adapted to time stamp and time align the power system data. In such an arrangement (not shown), the device 700 may further be adapted to receive time information from external time sources such as IRIG and IEEE 1588 and output such time information to both internal and external time clients. The time signal may be from a common time source. The common time source may be any time source available to several devices on the WAN. The common time source may include an absolute time source. Some examples of common time sources that may be used include: a clock internal to one of the devices on the WAN; a single clock on the WAN; a WWB time signal; a WWVB time signal; an IRIG-B signal from e.g. a global positioning system satellite system; and the like. Using the time source, the device 700 may be adapted to timestamp any data which is communicated via a messaging format or protocol which does not support time information. The timestamp may be generated in any form known in the art, including a Universal Coordinated Timestamp (UTC), Unix timestamp, an offset time, or the like. Examples of such messaging formats or protocols which do not support time information include Modbus and SEL Fast Message protocols.

Figure 7B:
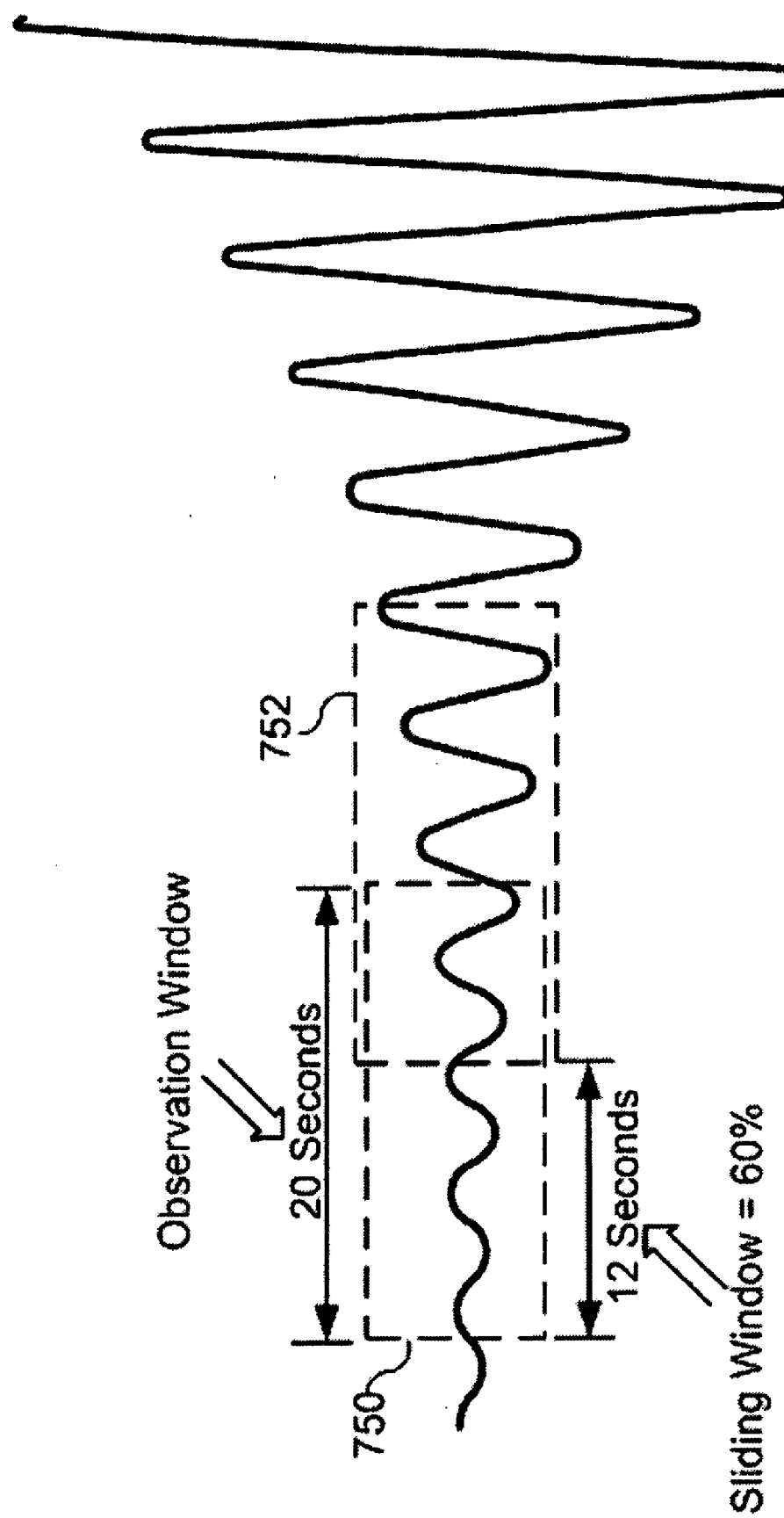
FIG. 7b is an illustration of overlapping sliding data windows which may be used by the processor of FIG. 7a in order to achieve real-time processing.

In this embodiment, the power system data received from the external PMCUs 710a, 710b over the bi-directional communications link 118 is sent to the processor 702. The processor 702 may be in the form of a Run Time System for data processing in generally about real-time, that is, the calculations do not exceed a predetermined processing interval. For example, in order to achieve real-time processing, the processor 702 may be adapted to complete any processing of the received data before the next set of data is received, or can start an independent modal analysis with overlapping sliding data windows 750 and 752 as shown in FIG. 7b. For example, as shown in FIG. 7b, the overlapping data windows 750 and 752 provide observation windows of about 20 seconds with about 8 seconds of overlap. Other real-time processing techniques may be implemented without deviating from the spirit of the invention.

The processor 702 may be generally in the form of a programmable logic controller (PLC) or any other suitable processing unit which performs scalar, vector or other complex calculations based on the aligned power system data to provide control data or an output signal for effecting other power system devices or elements to provide local or wide area protection, control, and monitoring to maintain power system stability. In one embodiment, the processor 702 may be adapted to use the IEC 61131-3 programming language, which is generally the standard programming language used in industrial control, SCADA system, DCS, and other power system applications.

The processor 702 may further include a modal analysis module 704, a mode identification module 706, and a local PMCU 708. The modal analysis module 704 generally analyzes the power system data and determines mode information from that data. The calculated mode information may include modal amplitude, phase, frequency, damping constant, and damping ratio. The modal analysis module 704 may include the process as outlined in FIG. 3.

From this mode information data, the mode identification module 706 may be adapted to identify such mode information and transmit data and/or signals in response thereto. For example, the mode identification module 706 may be adapted to determine, from the mode information, whether there is an undesirable oscillation in the electric power system. The mode identification module 706 may include the process and control logic as outlined in FIGS. 4 and 5. In response thereto, the mode identification module 706 may further be adapted to issue an alarm or a control signal which indicates that remedial action needs to be taken. The command module 712 sends these signals and/or data to the external PMCUs 710 a, 710b over the bi-directional communications link 118.

The processor 702 may further include a local PMCU 708, which may be adapted to receive calculated mode information from the modal analysis module 704. The local PMCU 708 may be adapted to analyze the calculated mode information from the modal analysis module and transmit data and/or signals to an external device (e.g., client 714).

Figure 8A:
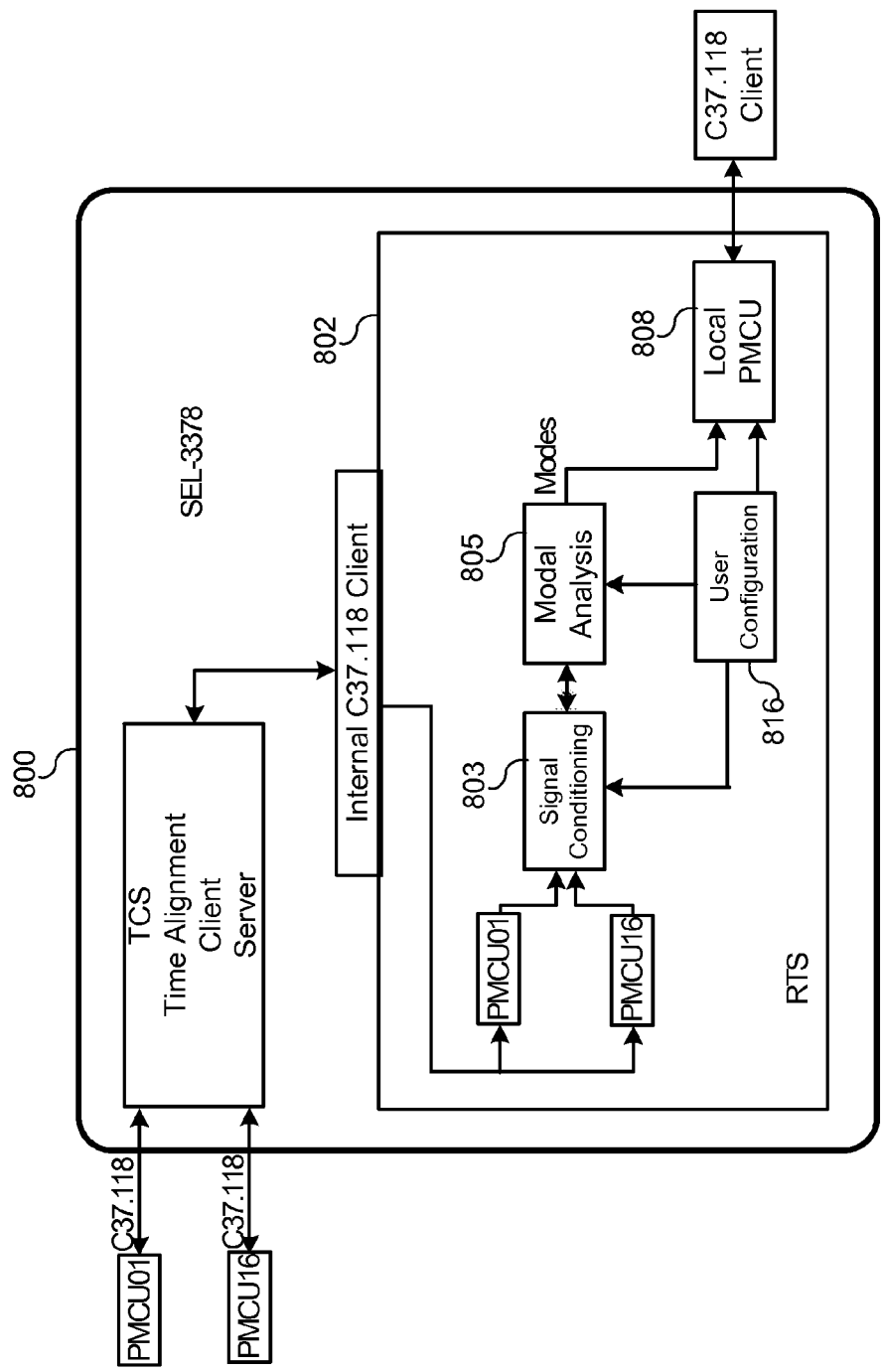
FIG. 8a is a general block diagram of a device including a signal conditioning module in addition to a modal analysis module.

The processor 702 may further include a user configuration module 716 which is coupled to the modal analysis module 704 and the local PMCU 708. The user configuration module 716 may be adapted to allow a user to define and configure the instructions or data of the modal analysis module 704. The user configuration module 716 may further be adapted to allow a user to define and configure the instructions, data or configuration of the local PMCU 708. For example, the user configuration module 716 may be used to configure the data to be transmitted to the client 714. FIG. 8a is a general block diagram of the internal architecture for a device 800 including a processor 802 having modal analysis module 805. In FIG. 8a only, the term "modal analysis" 805 has been used for simplicity purposes only. This modal analysis module 805 may include both the modal analysis module and the mode identification module of FIG. 7a. Accordingly, the modal analysis module 805 may be adapted to perform the process of as outlined in FIG. 3 and include the process and control logic as outlined in FIGS. 4 and 5.

The FIG. 8a device 800 is generally similar to the FIG. 7a device 700; however, device 800 additionally includes a signal conditioning module 803. The signal conditioning module 803 generally receives the power system data and prepares such data to be transferred to the modal analysis module 805. Accordingly, the signal conditioning module 803 prepares or conditions the data so that it is ready for the modal analysis. For example, if modal analysis is to be performed on a power value, the signal conditioning block 803 may be adapted to calculate power from the received power system data (e.g., voltage and current values). The signal conditioning block 803 may further be adapted to associate a time stamp to the calculated power quantity. Modal analysis and mode identification is then performed on the calculated power quantity using modal analysis module 805. In yet another example, if the value is ready to be processed by the modal analysis module 805 without further conditioning, the signal conditioning module 803 may be adapted to simply pass the data on to the modal analysis module 805 (e.g., a voltage or current value to be processed by the modal analysis module 805). That is, in some applications, signal conditioning is not required.

A user configuration module 816 may further be provided which is coupled to the signal conditioning module 803, the modal analysis module 805 and the local PMCU 808. The user configuration module 816 may be adapted to allow a user to define and configure the instructions or data of the modal analysis module 805 and/or the signal conditioning module 803. For example, the user configuration module 816 may be used to configure the data to be conditioned and processed by the signal conditioning module 803 and the modal analysis module 805, respectively.

Figure 8B:
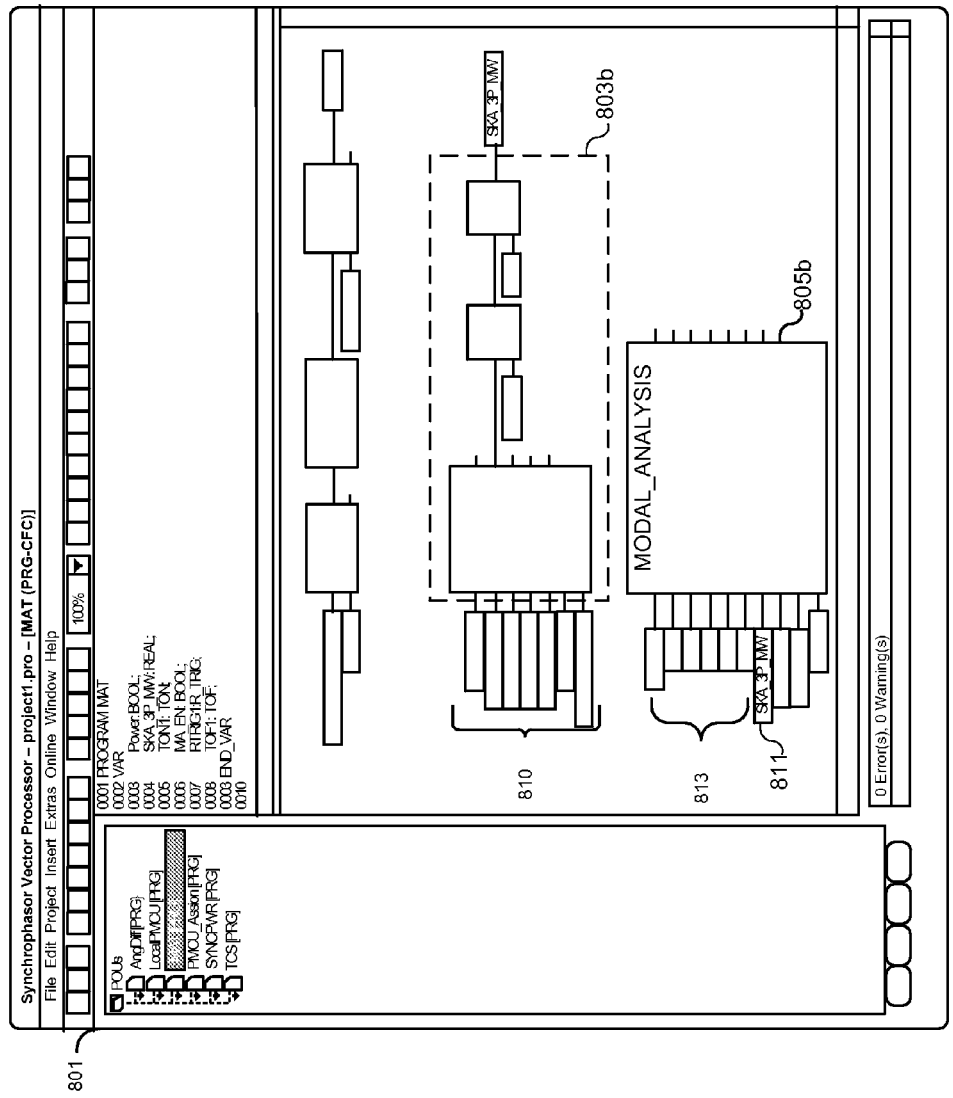

FIG. 8*b* is a screenshot of a user configuration software program 801 which may be adapted to provide the functionality of the user configuration module 816 of FIG. 8*a*. More specifically, the user configuration software program 801 provides a visual depiction and configuration tools for the signal conditioning module 803 (as shown at 803*b*) and modal analysis module 805 (as shown at 805*b*).

Using this configuration software program 801, a user may configure the signal conditioning module 803*b*. For example, a user may configure the plurality of inputs 810 (e.g., for voltage and current data) into the signal conditioning module 803*b*. With this data, the signal conditioning module 803*b* may be adapted to prepare or condition the data so that it is ready for the modal analysis. As shown in this screenshot, the signal conditioning block 803*b* is adapted to calculate power from the received power system data (e.g., voltage and current values). The signal conditioning block 803*b* may further be adapted to associate a time stamp to the calculated power quantity.

Using this configuration software program 801, a user may also configure the modal analysis module 805*b*. For example, a user may configure the input 811 of the modal analysis module 805*b* as the output of the signal conditioning module 803*b*. With this conditioned data, the modal analysis module 805*b* may be adapted to perform the modal analysis process as outlined in FIG. 3 and include the mode identification process and logic as outlined in FIGS. 4 and 5. As shown in this screenshot, the modal analysis module 805*b* is adapted to perform modal analysis on the conditioned power data from signal conditioning block 803*b*. The configuration software program 801 may further be adapted to enable the modal analysis module, configure the number of the modal analysis instance, configure the number of modes, configure the input signal data rate, configure the observation time, configure the sliding window in percent of the observation time, etc. as shown at 813

Figure 9:
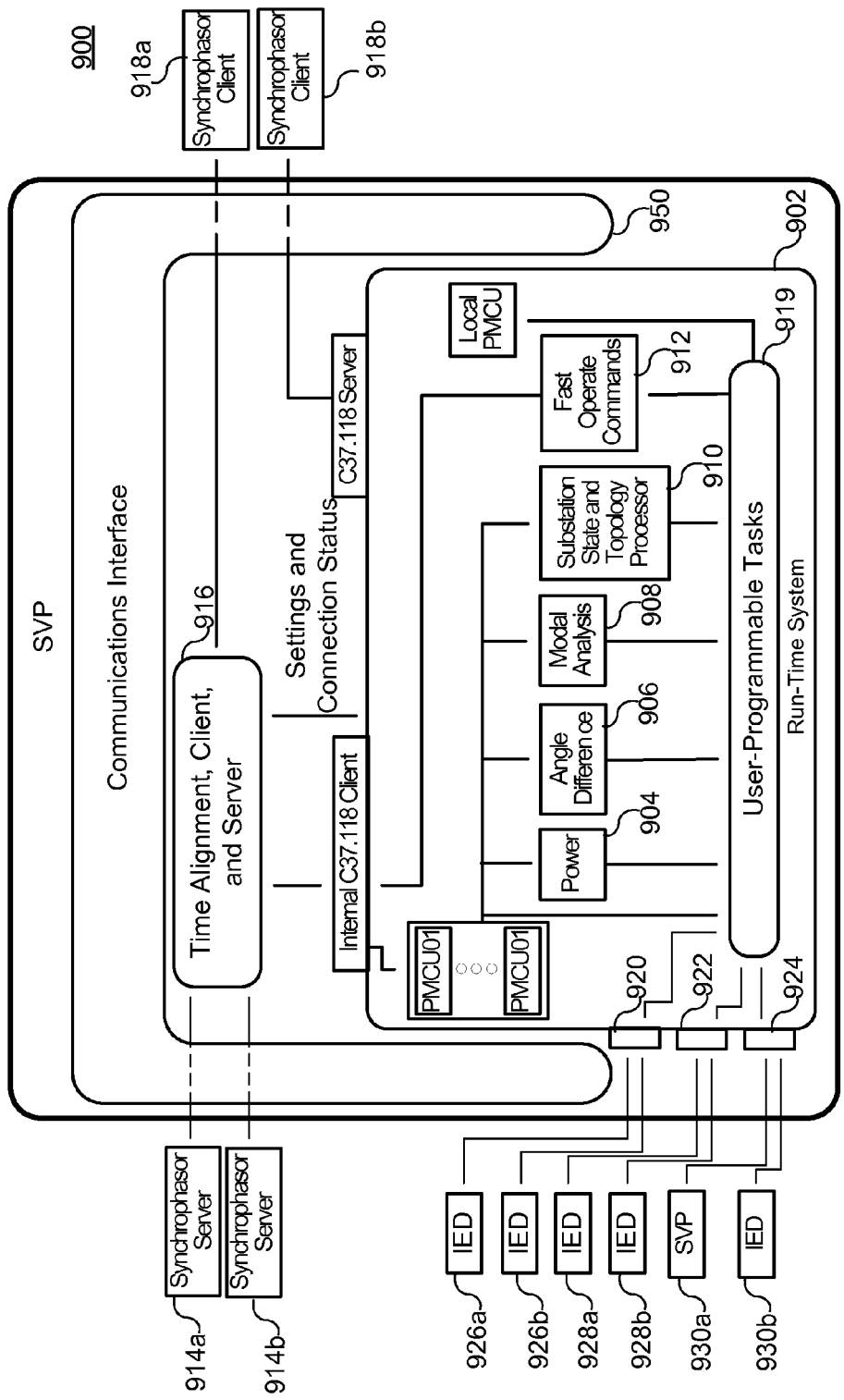
FIG. 9 is a block diagram of a processor including a run-time system for use in a device for monitoring and controlling an area of a power system by processing power system data including phasor data and transmitting control data or signals based on such processing to other power system devices in real-time.

FIG. 9 is a block diagram of a processor including a run-time system having a modal analysis module for use in a device for monitoring and controlling an area of a power system by processing power system data including phasor data and transmitting control data or signals based on such processing to other power system devices in real-time. In this embodiment, a processor 900 is provided having a run-time system 902 having a plurality of configurable power system control modules including a power calculation (PWRC) module 904, a phase angle difference monitor (PADM) 906, a modal analysis (MA) module 908, a substation state and topology processor (SSTP) 910, and a fast operate command module 912. Each module defines a set of scalar, vector and/or other complex calculations for determining control data or an output signal for effecting at least one of the various other power system devices or elements to provide local or wide area protection, control, and monitoring to maintain power system stability of the power system. In FIG. 9 only, the term "modal analysis" 908 has been used for simplicity purposes only. This modal analysis module 908 may include both a modal analysis module and the mode identification module. Accordingly, the modal analysis module 908 may be adapted to perform the process of as outlined in FIG. 3 and include the process and logic as outlined in FIGS. 4 and 5.

Generally, processor 900 includes a plurality of communications channels for receiving power system data including phasor data, phasor measurements, synchronized phasor measurements, from a plurality of power system devices or elements associated with an area of the power system (e.g, synchrophasor servers as shown at 914*a*, 914*b*). The power system data may be transferred via a number of communications messaging or protocols format/structures, including but not limited to IEEE C37.118 messages, serial communications, IP/Ethernet protocols (e.g., SCADA, and/or protection messages), input commands and the like.

Power system data may be measured accurately. Nevertheless, such data may be transferred to the processor 900 at different times due to unequal communication delays for each type of transferred data. Accordingly, a time alignment client server (TCS) 916 is provided for correlating and time aligning incoming power system data to compensate for any unequal communication delays.

The time aligned power system data is provided to the run-time system 902 similar to the run-time systems of FIGS. 7*a* and 8*a*. The run-time system 902 generally includes a power calculation (PWRC) module 904, a phase angle difference monitor (PADM) 906, a modal analysis (MA) module 908, a substation state and topology processor (SSTP) 910, and a fast operate command module 912, local PMCU, and User Programmable Tasks 919. Based on the desired power system control, the run-time system uses one or more of the run-time system modules to perform scalar, vector or other complex calculations based on the aligned power system data to provide control data or an output signal for effecting other power system devices or elements to provide local or wide area protection, control, and monitoring to maintain power system stability (e.g., synchrophasor client as shown at 918*a*, 918*b*, or synchrophasor servers as shown at 914*a*, 914*b*). The input and output of the run-time system 902 is preferably transferred using the IEEE C37.118 protocol due to the use of synchrophasors.

Regarding the Run-Time System 902, the power calculation module 904 generally calculates real and reactive power from voltage and current phasors and, based on such calculation, the user can program tasks for effecting other power system devices or elements to provide local or wide area protection, control, and monitoring to maintain power system stability. The phase angle difference monitor 906 generally calculates the angle difference between two phasor angles and, based on such calculation, provides an alarm signal if the difference exceeds a user defined threshold. The modal analysis module 908 is similar to the various embodiments discussed in FIGS. 2, 3, 4, 5, 6, 7*a*, 7*b*, 8*a*, and 8*b*. Accordingly, the modal analysis module 908 calculates and identifies modes of signals available within the Run Time System and, based on such calculation, provides control data or an output signal for effecting other power system devices or elements to provide local or wide area protection, control, and monitoring to maintain power system stability. The substation state and topology processor 910 identifies measurement errors, calculates current unbalance and symmetrical components, and refines voltage and current measurements. Based on such calculation, the substation and topology processor 910 provides control data or an output signal for effecting other power system devices or elements to provide local or wide area protection, control, and monitoring to maintain power system stability. The fast operate command module 912 is adapted to issue multiple commands to activate remote controls.

These Run-Time System modules are generally programmable such that a user may customize or define the computations to be calculated thereby via the user-programmable tasks module 919. The Run-Time System also allows the user to program custom logic independent of the modules mentioned above or using the outputs of the modules mentioned above. Due to the versatility of the various modules of the run-time system, the processor 900 of FIG. 9 may be applied to a number of power system control applications.

Processor 900 further includes communications interfaces 920, 922, 924 for receiving and sending other power system data from a plurality of power system devices or elements associated with an area of the power system (e.g., IEDs shown at 926a, 926b, 928a, 928b, and Synchrophasor Vector Processors (SVPs) shown at 930a, 930b). More specifically, communications interfaces 920, 922, 924 may be adapted to receive and transmit power system data that is not related to phasor data. For example, an IEC 61850-GOOSE interface 920 is provided that may be adapted to send and receive analog and digital GOOSE messages to power system devices or elements associated therewith (e.g., IEDs shown at 926a, 926b). An analog and digital interface 922 is provided (such as Mirrored Bits communications channel) that may be adapted to send and receive analog and input signals from power system devices or elements associated therewith (e.g., IEDs shown at 928a, 928b). A network interface 924 is provided that may be adapted to send and receive data (e.g., real, Boolean, complex values, and the like) to power system devices or elements associated therewith (e.g., SVPs shown at 930a, 930b).

The data received by communication interfaces 920, 922, 924 may be used in the user-programmable tasks module 919 to perform computations independently of any phasor data received via the time alignment client and server 916 and send out the results of these computations via any of the available communications interfaces (e.g., at 920, 922, 924, 950, etc.). Alternatively, the data received by communication interfaces 920, 922, 924 and/or the aligned power system data from 916 may be used by the run-time system or any one of the run-time system modules to perform scalar, vector or other complex calculations to provide control data or an output signal for effecting other power system devices or elements to provide local or wide area protection, control, and monitoring to maintain power system stability (e.g., synchrophasor clients as shown at 918a, 918b).

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

We claim:

1. A power system oscillation detection device for use in an electric power system, said electric power system including a plurality of intelligent electronic devices (IEDs) in communication with the power system, each IED sampling at least one signal from the power system, said power system oscillation detection device comprising:
   a real-time modal analysis module for calculating modes of at least one of the signals, each mode including mode information;
   a real-time mode identification module for determining, from the mode information, whether there is an undesirable oscillation in the electric power system; and,
   a run-time system configured to allow a user to program logic using outputs of the real-time modal analysis module and the real-time mode identification module.

2. The device of claim 1, further comprising a real-time decision and control logic configured to provide a control signal to initiate a corrective action if an undesireable oscillation is determined in the power system.

3. The device of claim 1, wherein the power system oscillation detection device is further adapted to receive a selected input signal into the modal analysis module from one of a group consisting of: frequency; phasor magnitude; phasor angle; analog value; power; angle difference; and combinations thereof.

4. The device of claim 1, wherein to calculate the mode information, the modal analysis module uses one selected from a group consisting of: Prony analysis; Matrix Pencil Analysis; Modified Prony analysis; Fourier analysis; and combinations thereof.

5. The device of claim 1 wherein the real-time modal analysis module is adapted to determine an estimated signal and compare such estimated signal with one of the sampled signals, said real-time modal analysis module further adapted to calculate a signal-to-noise ratio to determine the quality of the fit between the estimated signal and the compared sampled signal.

6. The device of claim 1, wherein the power system oscillation detection device further comprises a local phasor measurement unit module that receives the calculated mode information and transmits such data to an external client for power system monitoring, protection, automation, or control.

7. The device of claim 6, wherein the power system oscillation detection device further comprises a user configuration module adapted to receive configuration inputs from a user and provide them to the modal analysis module and the local phasor measurement unit module.

8. The device of claim 7, wherein the user configuration module output provides a signal to determine if the output is valid, a time quality signal, a PMCU status signal, a phasor data signal, a real data signal, a Boolean data signal, a signal that provides frequency, a rate of change in frequency versus time, and a reference to an error description.

9. The device of claim 1, wherein the mode information calculated by the modal analysis module is selected from a group consisting of: modal amplitude; phase; frequency; damping constant; damping ratio; and combinations thereof.

10. The device of claim 9, wherein the mode identification module is further adapred to provide a control signal to initiate a corrective action if an undesirable oscillation is determined in the power system and the damping ratio is below a select threshold.

11. The device of claim 9, wherein the mode identification module is further adapted to provide a control signal to initiate a corrective action command to at least one of the IEDs to correct the undesirable oscillation if the damping ratio alarm is active longer than a select threshold of time.

12. The device of claim 9, wherein the mode identification module is further adapted to provide an alarm or control signal if an undesirable oscillation is determined in the power system and the damping ratio is below a select threshold.

13. The device of claim 12, wherein the power system oscillation detection device further comprises a command module to route the alarm or control signal to selected external devices.

14. The device of claim 9, wherein the determination of an undesirable oscillation is achieved by comparing the mode amplitude with a select threshold.

15. The device of claim 14, wherein the mode identification module is further adapted to provide an alarm if the mode amplitude exceeds the select threshold.

16. The device of claim 14, wherein the mode identification module is further adapted to provide a control signal to initiate a corrective action if the mode amplitude of the at least one signal exceeds the select threshold.

17. A method for detecting oscillation in an electric power system using samples from a plurality of signals from a plurality of intelligent electronic devices (IEDs) in communication with the power system, the method including the steps of:
   acquiring the time stamped samples of a power system signal from one of the IEDs;
   calculating mode information from the time stamped samples;
   identifying a mode;
   programming logic using calculated mode information and identified mode, and
   detecting power system oscillation using the identified mode.

18. The method of claim 17, wherein to calculate the mode information, the step of determining the mode information of the time stamped samples comprises one selected from a group consisting of: Prony Analysis; Modified Prony analysis; Fourier analysis; and combinations thereof.

19. The method of claim 17, wherein the method operates in real-time.

20. The method of claim 17, further including the step providing an alarm or a control signal to a select external device after oscillation is detected.

21. The method of claim 17, further including the step of providing a control signal to an external device if the alarm is longer than a select threshold of time.

22. A system for power system oscillation detection using modal analysis, comprising:
   a plurality of intelligent electronic devices (IEDs) connected to the electric power system and adapted to sample a signal from the electric power system and communicate the samples; and
   a local IED adapted to receive the samples, including:
      a real-time modal analysis module for calculating mode information from at the signal;
      a real-time mode identification module for determining, from the mode information, whether there is an undesirable oscillation in the electric power system; and,
      a run-time system configured to allow a user to program logic using outputs of the real-time modal analysis module and the real-time mode identification module.

23. The system of claim 22, wherein the power system oscillation detection device is further adapted to receive a selected input signal into the modal analysis module from a group consisting of: frequency; phasor magnitude; phasor angle; analog value; power; angle difference; and combinations thereof.

24. The system of claim 22, wherein to calculate the mode information, the modal analysis module uses one selected from a group consisting of: Prony analysis; Matrix Pencil Analysis; Modified Prony analysis; Fouier analysis; and combinations thereof.

25. The system of claim 22 wherein the real-time modal analysis module of the local IED is adapted to determine an estimated signal and compare such estimated signal with one of the sampled signals, said real-time modal analysis module further adapted to calculate a signal-to-noise ratio to determine the quality of the fit between the estimated signal and the compared sampled signal.

26. The system of claim 22, wherein the power system oscillation detection device further comprises a local phasor measurement unit module that receives the calculated mode information and tranmits such data to an external client for power system monitoring, protection, automation, or control.

27. The system of claim 26, wherein the power system oscillation detection device further comprises a user configuration module adapted to receive configuration inputs from a user and provide them to the modal analysis module and the local phasor measurement unit module.

28. The system of claim 27, wherein the user configuration module output provides a signal to determine if the output is valid, a time quality signal, a PMCU status signal, a phasor data signal, a real data signal, a Boolean data signal, a signal that provides frequency, a rate of change in frequency versus time, and a reference to an error description.

29. The system of claim 22, wherein the mode information calculated by the modal anaylsis module is selected from a group consisting of: modal amplitude; phase;
   frequency; damping constant; damping ratio; and combinations thereof.

30. The system of claim 29, wherein the mode identification module is further adapted to provide an alarm or control signal if an undesirable oscillation is determined in the power system and the damping ratio is below a select threshold.

31. The system of claim 29, wherein the mode identification module is further adapted to provide a control signal to initiate a corrective action if an undesirable oscillation is determined in the power system and the damping ratio is below a select threshold.

32. The system of claim 29, wherein the mode identification module is further adapted to provide a control signal to initiate a corrective action command to at least one of the IEDs to correct the undesirable oscillation if the damping ratio alarm is active longer than a select threshold of time.

33. The system of claim 32, wherein the power system oscillation detection device further comprises a command server to route the alarm or control signal to selected external devices.

34. The system of claim 29, further comprising a real-time decision and control logic configured to provide a control signal to initiate a corrective action if an undesireable oscillation is determined in the power system.

35. The system of claim 34, wherein the mode identification module is further adapted to provide an alarm or a control signal if the mode amplitude of the at least one signal exceeds the select threshold.

36. The system of claim 34, wherein the mode identification module is further adapted to provide a control signal to initiate a corrective action if the mode amplitude of the at least one signal exceeds the select threshold.

* * * * *